United States Patent
Cheng et al.

(10) Patent No.: US 10,935,516 B2
(45) Date of Patent: Mar. 2, 2021

(54) ION-SENSITIVE FIELD-EFFECT TRANSISTOR FORMED WITH ALTERNATING DIELECTRIC STACK TO ENHANCE SENSITIVITY

(71) Applicant: INTERNATIONAL BUSINESS MACHINES CORPORATION, Armonk, NY (US)

(72) Inventors: Kangguo Cheng, Schenectady, NY (US); Chanro Park, Clifton Park, NY (US); Juntao Li, Cohoes, NY (US); Ruilong Xie, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 70 days.

(21) Appl. No.: 16/352,055

(22) Filed: Mar. 13, 2019

(65) Prior Publication Data

US 2020/0292490 A1  Sep. 17, 2020

(51) Int. Cl.
 *G01N 27/414* (2006.01)
 *H01L 21/8234* (2006.01)

(52) U.S. Cl.
 CPC . *G01N 27/4148* (2013.01); *H01L 21/823493* (2013.01)

(58) Field of Classification Search
 CPC ............ G01N 27/4148; H01L 21/823493
 See application file for complete search history.

(56) References Cited

U.S. PATENT DOCUMENTS

| | | |
|---|---|---|
| 5,138,251 A | 8/1992 | Koshiishi et al. |
| 6,017,775 A | 1/2000 | Igel et al. |
| 6,346,455 B1 | 2/2002 | Thakur et al. |
| 6,737,699 B2 | 5/2004 | Block et al. |
| 7,211,459 B2 | 5/2007 | Yang |
| 7,321,143 B2 | 1/2008 | Kunath et al. |
| 8,642,371 B2 | 2/2014 | Mohajerzadeh et al. |
| 9,678,037 B2 | 6/2017 | Liang et al. |
| 2010/0237467 A1* | 9/2010 | Dalton ............... H01L 28/20 257/536 |
| 2010/0273672 A1 | 10/2010 | Demoustier-Champagne et al. |
| 2014/0191293 A1* | 7/2014 | Bustillo ............ G01N 27/4148 257/253 |

(Continued)

OTHER PUBLICATIONS

Cheah, "An Integrated Circuit for Chip-Based Analysis of Enzyme Kinetics and Metabolite Quantification", IEEE Transactions on Biomedical Circuits and Systems, vol. 10, No. 3, Jun. 2016, pp. 721-730.

*Primary Examiner* — Steven H Loke
*Assistant Examiner* — Juanita B Rhodes
(74) *Attorney, Agent, or Firm* — Tutunjian & Bitetto, P.C.; Randall Bluestone (57) ABSTRACT

A method for fabricating a semiconductor device including an ion-sensitive field-effect transistor (ISFET) with enhanced sensitivity includes forming a microwell within a stack including alternating dielectric layers formed on a semiconductor chip corresponding to an ISFET. Forming the stack includes forming a first dielectric layer including a first material and a second dielectric layer including a second material. The method further includes etching the second dielectric layer selective to at least the first dielectric layer using a wet etch process, and forming a macrowell from the microwell having a shape defined by the etching.

19 Claims, 10 Drawing Sheets

(56) References Cited

U.S. PATENT DOCUMENTS

2014/0308752 A1* 10/2014 Chang ................ G01N 27/4145
436/501
2017/0062355 A1* 3/2017 Liang .................... H01L 23/562
2018/0052132 A1 2/2018 Santangelo et al.

* cited by examiner

ION-SENSITIVE FIELD-EFFECT TRANSISTOR FORMED WITH ALTERNATING DIELECTRIC STACK TO ENHANCE SENSITIVITY

BACKGROUND

The present invention generally relates to semiconductor devices, and more particularly to ion-sensitive field-effect transistors (ISFETs) formed with alternating dielectric stacks to enhance sensitivity and methods of forming the same.

An ion-sensitive field-effect transistor (ISFET) is a transistor that can be used to measure ion concentration in a solution. More specifically, the ion concentration can be measured based on current flowing through the ISFET, which can change in accordance with changes in ion concentration. The solution can be separated from the channel by an ion-sensitive barrier and a gap that allows a substance under test to come in contact with the sensitive barrier. A threshold voltage of the ISFET can depend on the acidity/basicity (e.g., pH) of the substance under test in contact with the ion-sensitive barrier. Electrical charge can be measured by a change in the threshold voltage of the ISFET to sense an analyte solution (e.g., bio or chemical) in the well of the ISFET. ISFETs can be fabricated along with metal-oxide semiconductor FETs (MOSFETs) to make "lab-on-chip" devices in which the ISFETs are used as sensors (e.g., biosensors and/or chemical sensors) and the MOSFETs are used for signal processing.

SUMMARY

In accordance with an embodiment of the present invention, a method for fabricating a semiconductor device including an ion-sensitive field-effect transistor (ISFET) with enhanced sensitivity is provided. The method includes forming a microwell within a stack including alternating dielectric layers formed on a semiconductor chip corresponding to an ISFET. Forming the stack includes forming a first dielectric layer including a first material and a second dielectric layer including a second material. The method further includes etching the second dielectric layer selective to at least the first dielectric layer using a wet etch process, and forming a macrowell from the microwell having a shape defined by the etching.

In accordance with another embodiment of the present invention, a method for fabricating a semiconductor device including an ion-sensitive field-effect transistor (ISFET) with enhanced sensitivity is provided. The method includes forming a stack including alternating dielectric layers on a semiconductor chip corresponding to an ISFET. Forming the stack includes forming a first dielectric layer including a carbon doped oxide dielectric material on the semiconductor chip, and forming a second dielectric layer including silicon dioxide on the first dielectric layer. The method further includes forming a microwell within the stack, etching the second dielectric layer selective to at least the first dielectric layer using a wet etch process employing diluted hydrofluoric acid, and forming a macrowell from the microwell having a shape defined by the etching.

In accordance with yet another embodiment of the present invention, a semiconductor device including an ion-sensitive field-effect transistor (ISFET) with enhanced sensitivity is provided. The device includes a semiconductor chip, a stack of alternating dielectric layers having a comb shape disposed on the semiconductor chip, and a macrowell defined by the comb shape of the stack. The stack includes a first dielectric layer including a first material and a second dielectric layer including a second material.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

The embodiments described herein provide for a ion-sensitive field-effect transistor (ISFET) having an alternating dielectric stack. The use of passivation layer can be needed between an analyte solution and the gate, as opposed to the analyte solution directly contacting the gate. However, the use of the passivation layer can reduce the sensitivity of the ISFET. To enhance the sensitivity of the ISFET, the dielectric layers of the alternating dielectric stack can be selectively etched in accordance with the embodiments described herein to increase total capacitor surface area.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well as any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
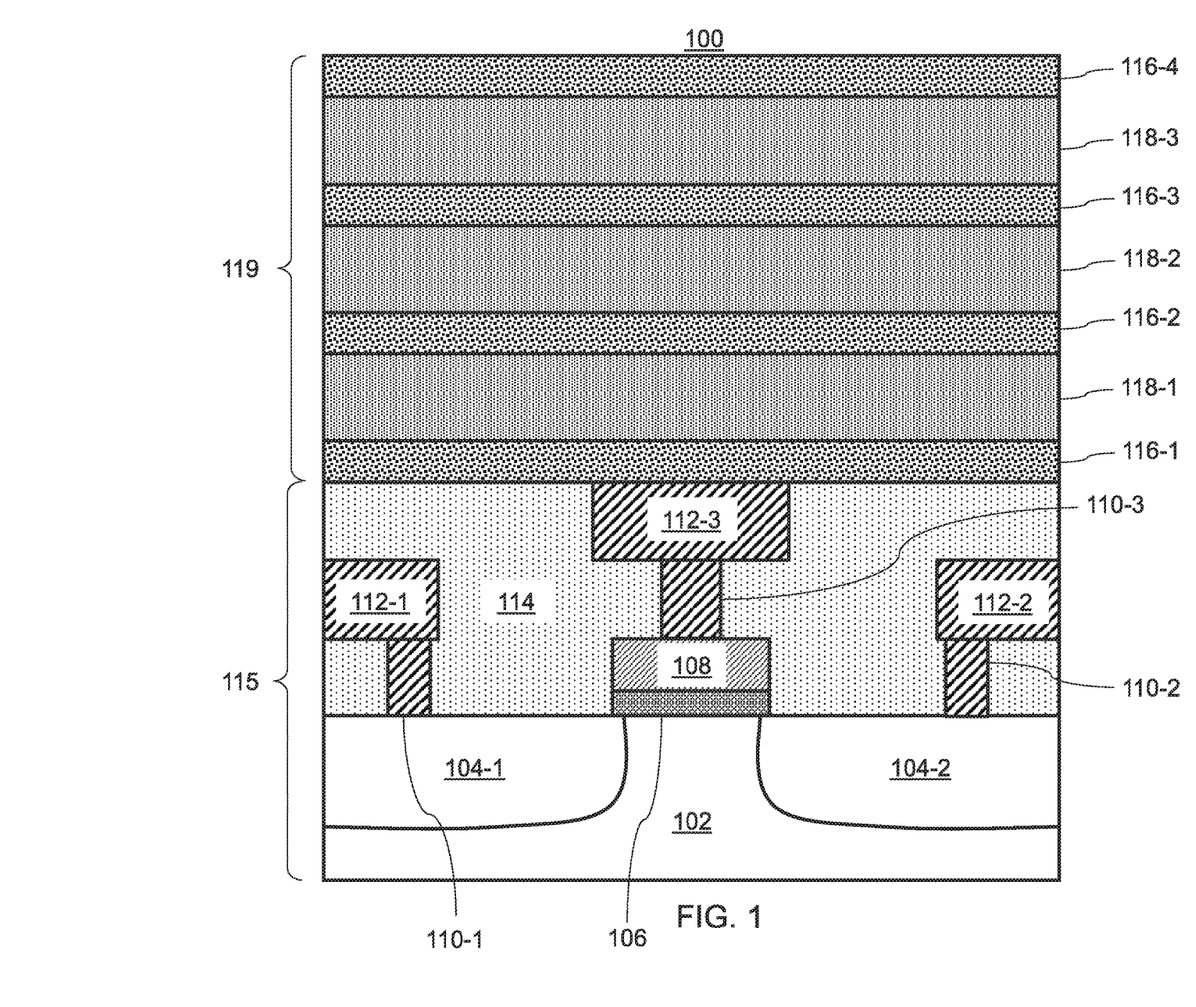
FIG. 1 is a cross-sectional view of a stack of alternating dielectric layers formed during the fabrication of a semiconductor device, in accordance with an embodiment of the present invention.

Referring now to the drawings in which like numerals represent the same or similar elements and initially to FIG. 1, a cross-sectional view of a semiconductor device 100 is provided. Illustratively, as will be described in FIGS. 1-9, the device 100 can include an ISFET.

As shown, the device 100 includes a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown, source/drain regions 104-1 and 104-2 are formed on the substrate 102. The source/drain regions 104-1 and 104-2 can be formed using any suitable process in accordance with the embodiments described herein. In one embodiment, the source/drain regions 104-1 and 104-2 can include n-type doped regions forming an n-type FET (NFET). In another embodiment, the source/drain regions 104-1 and 104-2 can include p-type doped regions forming a p-type FET (PFET).

As further shown, a gate dielectric layer 106 is formed on the substrate between the source/drain regions 104-1 and 104-2, and a gate conductor layer 108 is formed on the gate dielectric layer 106. The gate dielectric layer 106 and the gate conductor layer 108 collectively form what is referred to herein as a gate structure.

The gate dielectric layer 106 can include any suitable dielectric material in accordance with the embodiments described herein. In one embodiment, the gate dielectric layer 106 can include a high-k dielectric material. As used herein, a high-k dielectric material refers to a dielectric material having a dielectric constant (k) higher than the dielectric constant of silicon oxide at room temperature (e.g., about 20° C. to about 25° C.) and atmospheric pressure (about 1 atm). For example, a high-k dielectric material can have a dielectric constant greater than 4.0. In another example, the high-k gate dielectric material can have a dielectric constant greater than 7.0. Examples of suitable high-k dielectric materials that the gate dielectric layer 106 can be formed from include, but are not limited to, hafnium oxides, hafnium silicon oxides, hafnium silicon oxynitrides, lanthanum oxides, lanthanum aluminum oxides, zirconium oxides, zirconium silicon oxides, zirconium silicon oxynitrides, tantalum oxides, titanium oxides, barium strontium titanium oxides, barium titanium oxides, strontium titanium oxides, yttrium oxides, aluminum oxides, lead scandium tantalum oxides, lead zinc niobates, etc.

The gate dielectric layer 106 can be formed using any suitable process in accordance with the embodiments described herein. Examples of processes that can be used to form the gate dielectric layer 106 include, but are not limited to, a chemical vapor deposition (CVD) process and/or an atomic layer deposition (ALD) process. Variations of CVD processes suitable for depositing the gate dielectric layer 106 include, but are not limited to, atmospheric pressure CVD (APCVD), low-pressure CVD (LPCVD), plasma-enhanced CVD (PECVD), metalorganic CVD (MOCVD), etc.

The gate conductor layer 108 can include any suitable conductive material in accordance with the embodiments described herein. Example of suitable conductive materials that the gate conductor layer 108 can be formed from include, but are not limited to metals, metal alloys, metal nitrides and metal silicides, as well as laminates thereof and composites thereof. Examples of suitable conductive materials that can be used to form the gate conductor layer include, but are not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO$_2$), cobalt silicide (CoSi), nickel silicide (NiSi)), transition metal aluminides (e.g. Ti$_3$Al, ZrAl), TaC, TaMgC, carbon nanotube, conductive carbon, graphene, etc. The conductive material can further include dopants that are incorporated during or after deposition.

As another example, the gate conductor layer 108 can include a doped semiconductor material. More specifically, such doped semiconductor materials can include, e.g., doped polysilicon and/or polysilicon-germanium alloy materials having a dopant concentration from, e.g., about $1 \times 10^{18}$ dopant atoms per cubic centimeter to about $1 \times 10^{22}$ dopant atoms per cubic centimeter, and/or polycide materials (e.g., doped polysilicon/metal silicide stack materials).

The gate conductor layer 108 can be formed by any suitable process in accordance with the embodiments described herein. Examples of processes that can be used to form the gate conductor layer 108 include, but are not limited to, ALD, CVD, physical vapor deposition (PVD), sputtering, plating, evaporation, ion beam deposition, electron beam deposition, laser assisted deposition, chemical solution deposition, etc. Dielectric spacers (not shown) may present at sidewalls of the gate dielectric layer 106 and/or the gate conductor layer 108.

As further shown, a plurality of contacts are formed, including a source/drain contact 110-1, a drain/source contact 110-2 and a gate contact 110-3. Additionally, back-end-of-line (BEOL) structures 112-1 through 112-3 are formed on contacts 110-1 through 110-3, respectively. The contacts 110-1 through 110-3 and the BEOL structures 112-1 through 112-3 can be formed using any suitable processes, and can include any suitable conductive material, in accordance with the embodiments described herein. Examples of suitable materials that the contacts 110-1 through 110-3 and the BEOL structures 112-1 through 112-3 can be formed from include, but are not limited to, tungsten (W), cobalt (Co), ruthenium (Ru), copper (Cu), etc. In some embodiments, the contacts 110-1 through 110-3 can include a barrier layer (not show) including a barrier material that can prevent diffusion and/or alloying of the conductive metal-containing fill material with an underlying material may be formed into the opening prior to filling the opening with a conductive metal-containing fill material. Examples of suitable barrier materials include, but are not limited to, titanium nitride (TiN), tantalum nitride (TaN), hafnium nitride (HfN), niobium nitride (NbN), tungsten nitride (WN), tungsten carbon nitride (WCN), etc. The barrier layer can be formed in the contact openings by a deposition process such as, for example, chemical vapor deposition (CVD), plasma enhanced chemical vapor deposition (PECVD), atomic layer deposition (ALD), or metalorganic chemical vapor deposition (MOCVD). A planarization process may follow the filling of each opening with the conductive metal-containing fill material.

As further shown, dielectric material 114 is formed. The dielectric material 114 can be formed suing any suitable process, and can include any suitable material, in accordance with the embodiments described herein. For example, the dielectric material 114 can include, e.g., a carbon doped oxide dielectric (e.g., SiCOH).

Components 102 through 114 collectively formed what is referred to herein as a semiconductor chip, or integrated circuit, 115.

As further shown, a stack 119 is formed on the semiconductor chip 115. The stack 119 can be formed by depositing alternating layers of dielectric material. More specifically, as shown, the stack 119 can include alternating first dielectric layers 116-1 through 116-4 and second dielectric layers 118-1 through 118-3.

The stack 119 can be formed using any suitable process, and the dielectric layers can include any suitable materials, in accordance with the embodiments described herein. For example, the first dielectric layers 116-1 through 116-4 can include, e.g., a carbon doped oxide dielectric material (e.g., SiCOH), and the second dielectric layers 118-3 through 118-3 can include, e.g., $SiO_2$.

Figure 2:
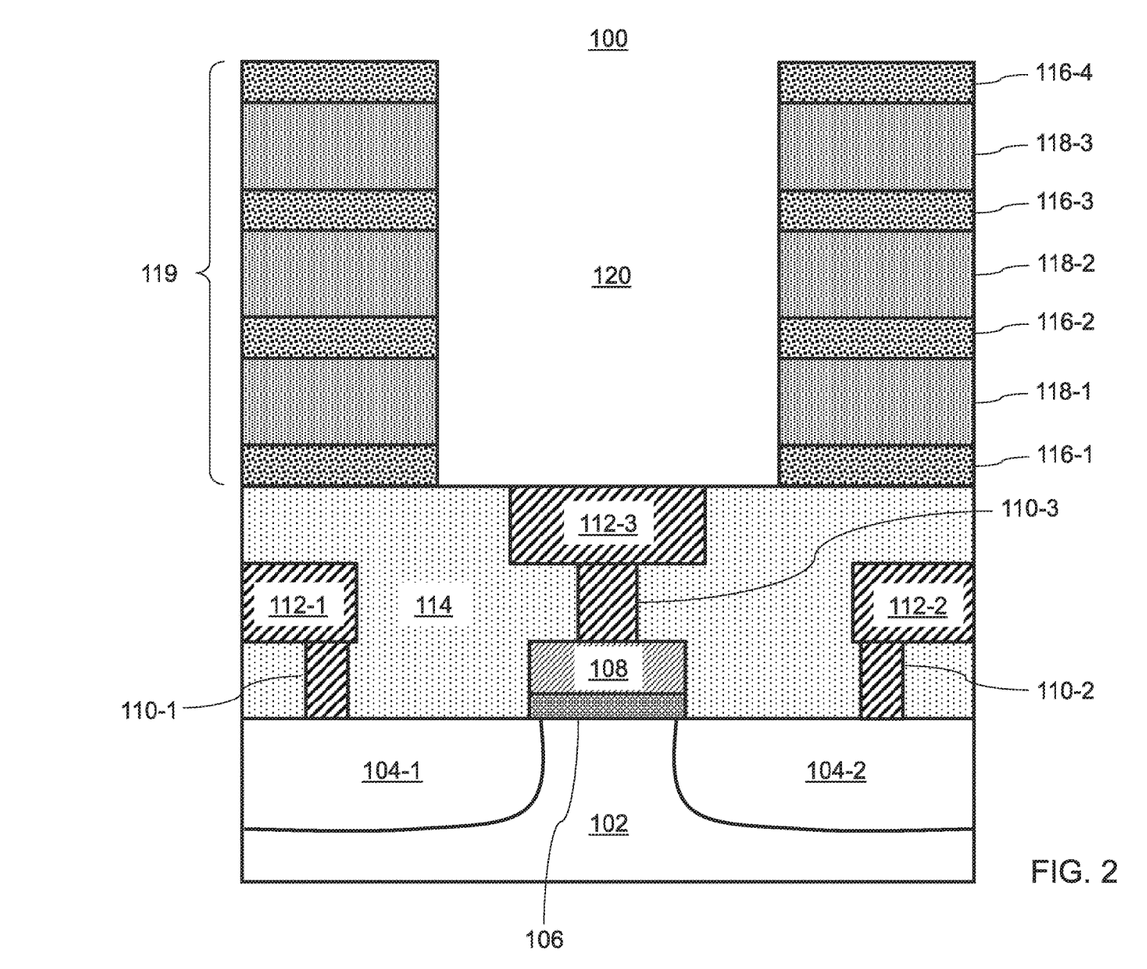
FIG. 2 is a cross-sectional view of the formation of a microwell during the fabrication of the semiconductor device, in accordance with an embodiment of the present invention.

With reference to FIG. 2, a microwell 120 is formed within the stack 119. The microwell 120 can be formed by etching through the stack, and stopping on the top surface of the semiconductor chip 115. For example, a mask (not shown) can be used to perform the etching, and removed (e.g., stripped) after the microwell 120 is formed.

Figure 3:
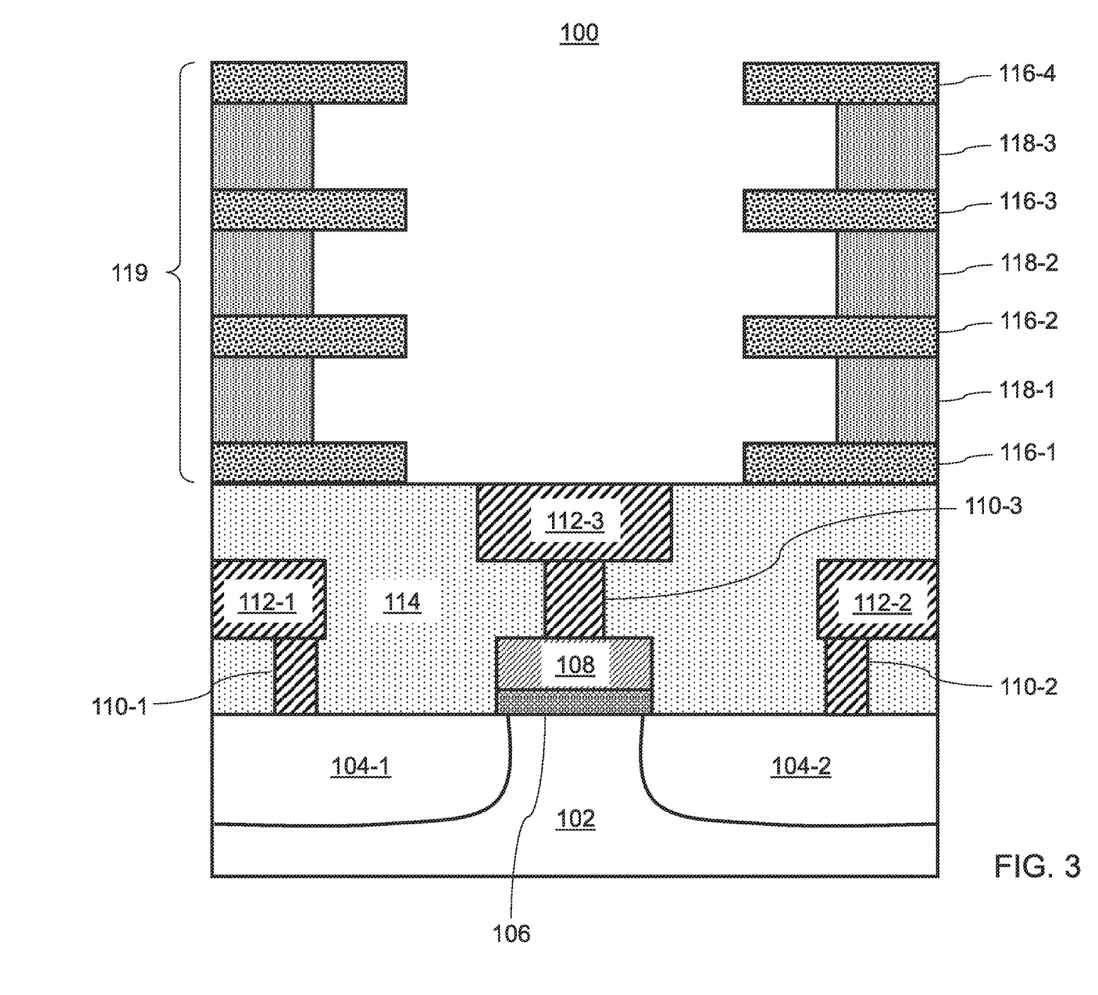
FIG. 3 is a cross-sectional view of selective etching of the stack performed during the fabrication of the semiconductor device, in accordance with an embodiment of the present invention.

With reference to FIG. 3, the dielectric layers 118-1 through 118-3 are etched selective to the dielectric layers 116-1 through 116-4, the BEOL structure 112-3 and the dielectric material 114. In one embodiment, a wet etch process is used to perform the selective etch. For example, diluted hydrofluoric acid (DHF) can be used to perform the selective etch.

The geometry resulting from the selective etch process (e.g., "comb" shaped geometry) can permit increased capacitor surface area as compared to other geometries (e.g., rectangular shaped geometries). As will be described in further detail below, sensitivity can be enhanced due to the increased capacitor surface area achieved by this geometry.

Figure 4:
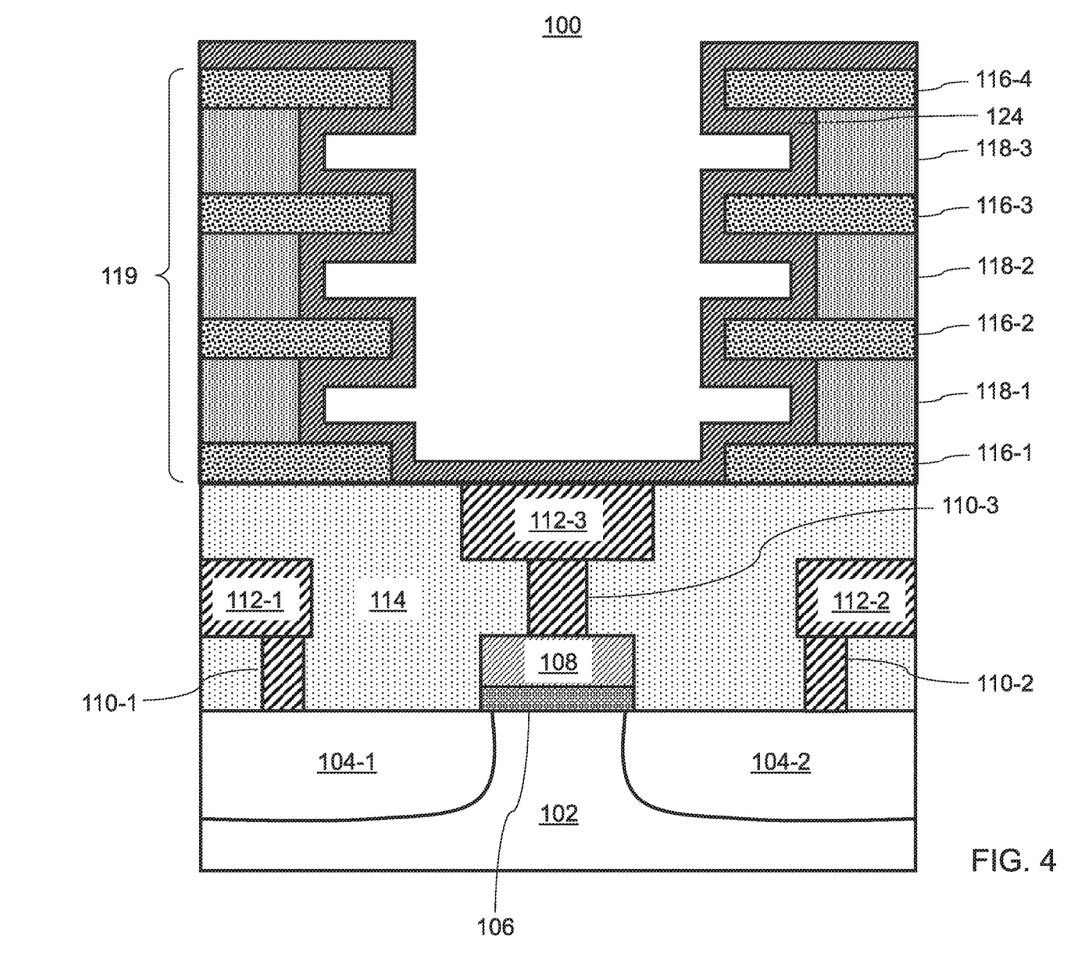
FIG. 4 is a cross-sectional view of removal of a mask and the formation of a conductive layer during the fabrication of the semiconductor device, in accordance with an embodiment of the present invention.

With reference to FIG. 4, a conductive layer 124 is formed along exposed surfaces of the device 100. For example, the conductive layer 124 can be conformally deposited along the exposed surfaces of the dielectric material 114, the BEOL structure 112-3 and the stack 119.

The conductive layer 124 can include any suitable conductive material (e.g., metal) in accordance with the embodiments described herein. Examples of suitable materials that the conductive layer 124 can be formed from include, but are not limited to, ruthenium (Ru), gold (Au), platinum (Pt), palladium (Pd), nickel (Ni), cobalt (Co), aluminum (Al), silver (Ag), etc. The conductive layer 124 can be formed using any suitable process in accordance with the embodiments described herein. Examples of suitable processes that can be used to form the conductive layer 124 include, but are not limited to, atomic layer deposition (ALD), chemical vapor deposition (CVD), physical vapor deposition (PVD), etc.

Figure 5:
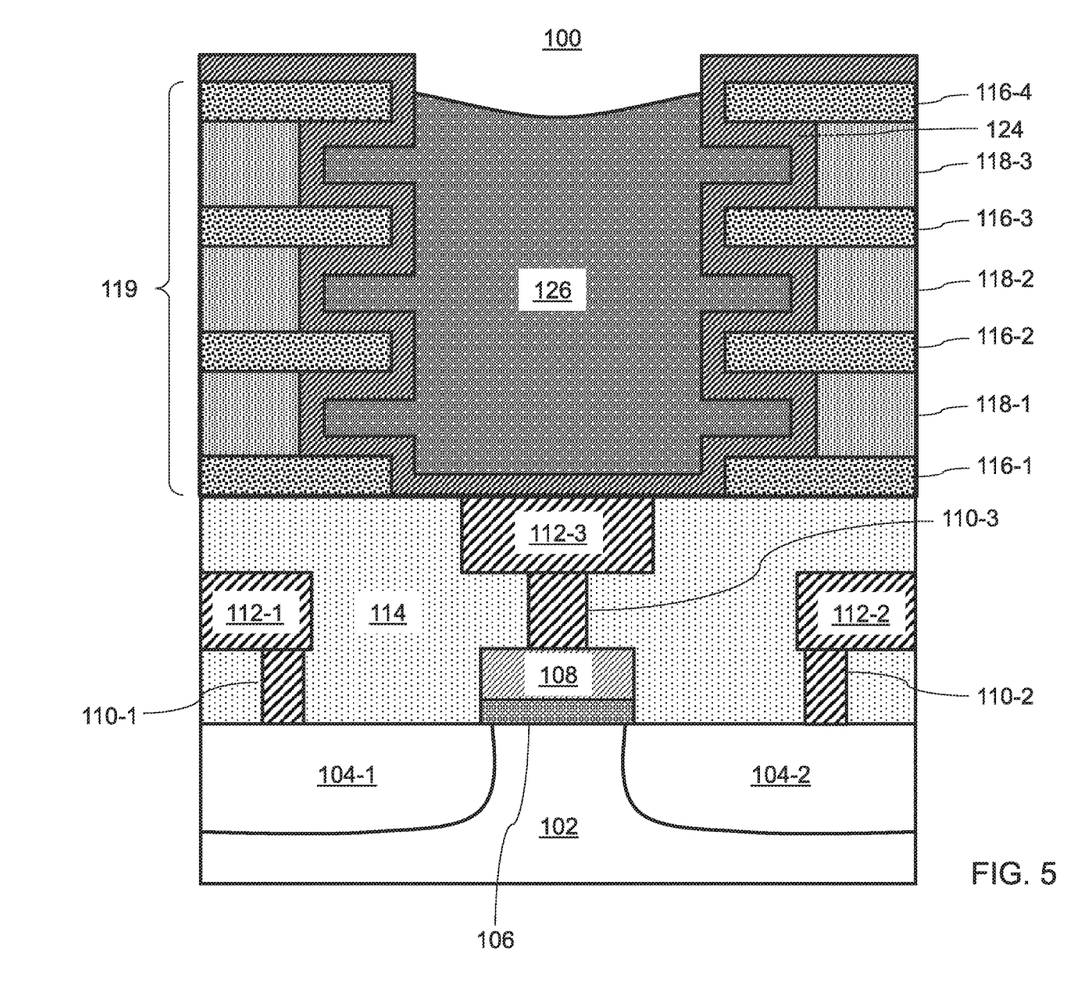
FIG. 5 is a cross-sectional view of the filling of the microwell with a sacrificial material during the fabrication of the semiconductor device, in accordance with an embodiment of the present invention.

With reference to FIG. 5, a sacrificial layer 126 is formed within the stack 119. As shown, the sacrificial layer 126 can be formed to a height within the stack 119 (e.g., up to a height of the dielectric layer 116-4). The sacrificial layer 126 can be formed by filling the microwell 120 with a sacrificial material, and planarizing and recessing the sacrificial layer 126 to the height within the stack 119 to expose the portions of the conductive layer 124 disposed on the top surfaces of the dielectric layer 116-4. In one embodiment, the sacrificial material 126 can include an optical planarization layer (OPL) (e.g., an organic planarization layer). However, the sacrificial material 126 can include any suitable material in accordance with the embodiments described herein.

Figure 6:
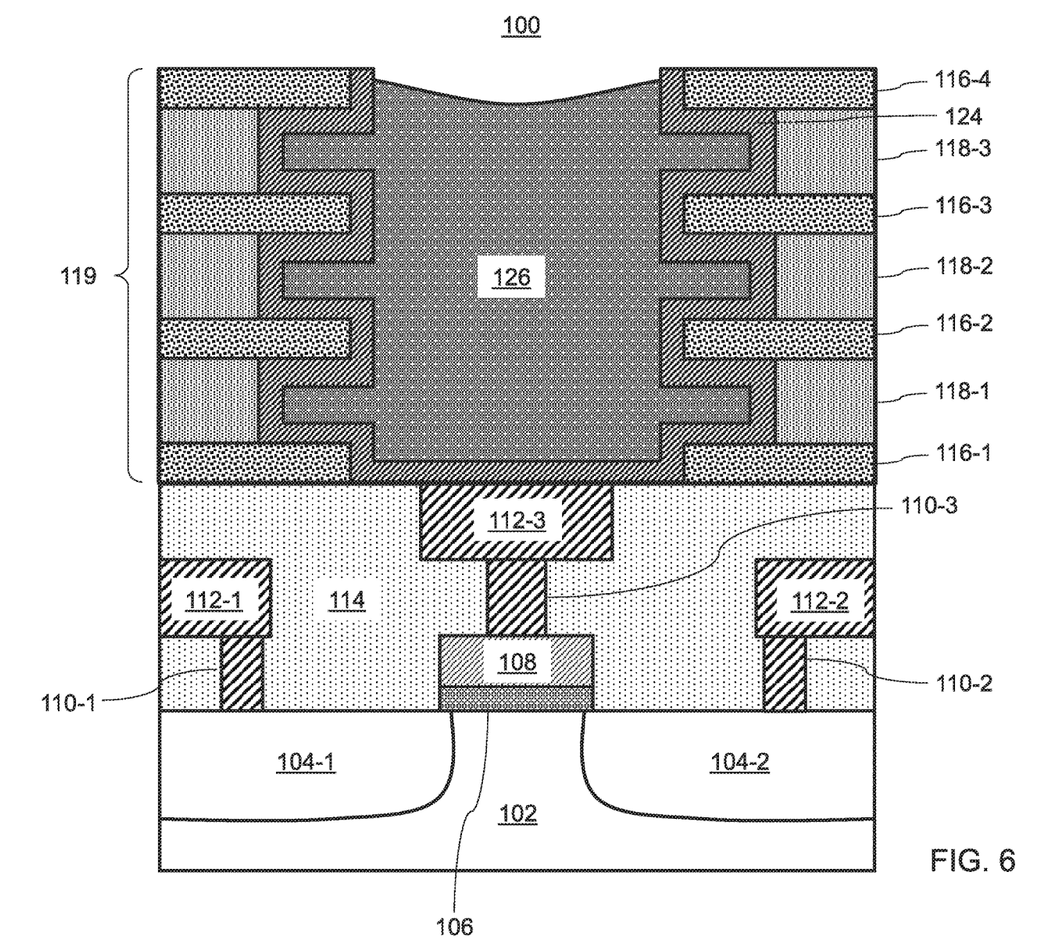
FIG. 6 is a cross-sectional view of the removal of exposed portions of the conductive layer during the fabrication of the semiconductor device, in accordance with an embodiment of the present invention.

With reference to FIG. 6, the exposed portions of the conductive layer 124 are removed. The exposed portions of the conductive layer 124 can be removed using any suitable process in accordance with the embodiments described herein.

Figure 7:
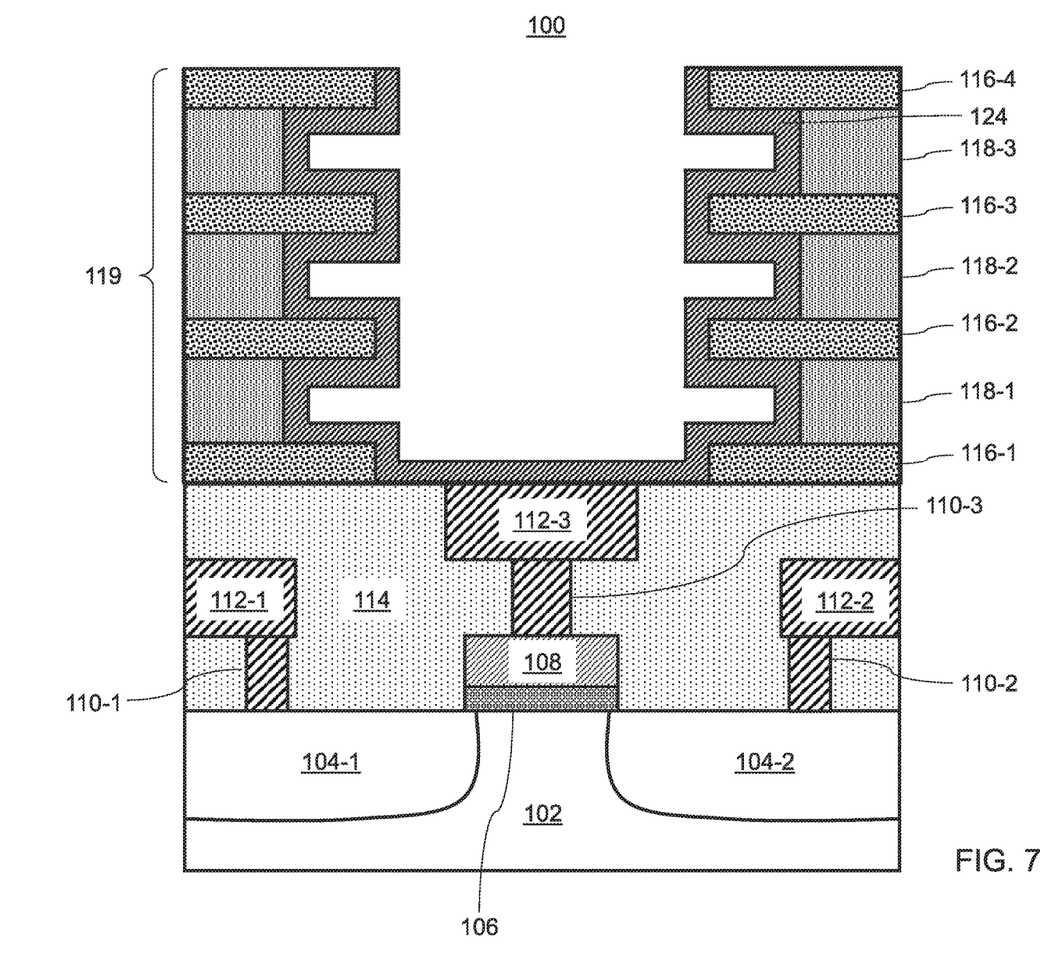
FIG. 7 is a cross-sectional view of the removal of the sacrificial material during the fabrication of the semiconductor device, in accordance with an embodiment of the present invention.

With reference to FIG. 7, the sacrificial layer 126 is removed (e.g., stripped). The sacrificial layer 126 can be removed using any suitable process in accordance with the embodiments described herein.

Figure 8:
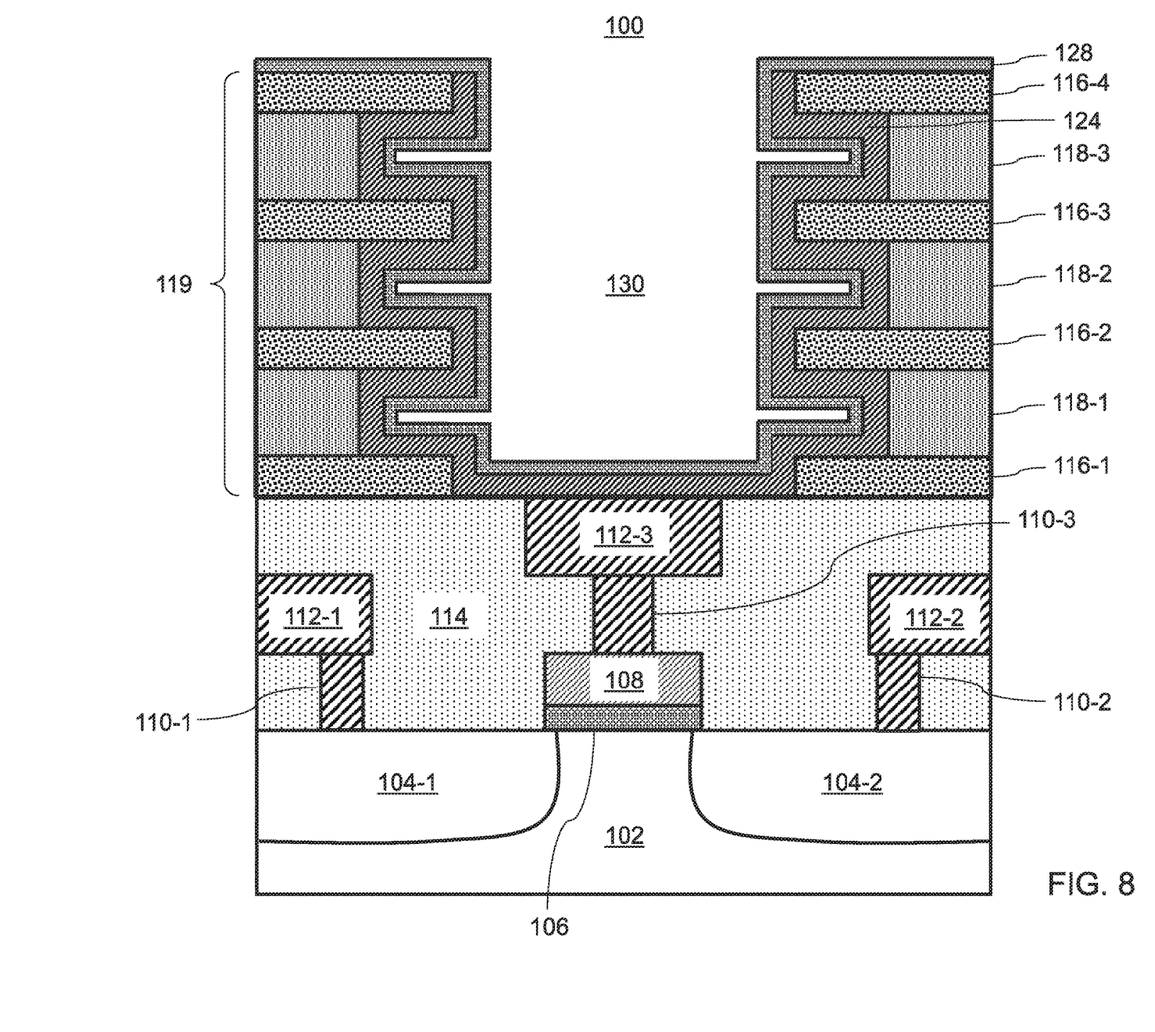
FIG. 8 is a cross-sectional view of the formation of a passivation layer to create a macrowell from the microwell during the fabrication of the semiconductor device, in accordance with an embodiment of the present invention.

With reference to FIG. 8, a passivation layer 128 is formed to create a macrowell 130. The passivation layer 128 can be formed using any suitable process in accordance with the embodiments described herein. For example, the passivation layer 128 can be conformally deposited along exposed surfaces of the dielectric layer 116-4 and the conductive layer 124. The passivation layer 128 can have a thickness greater than that of the gate dielectric 106.

The passivation layer 128 can be used to, e.g., (1) prevent ions (e.g., sodium (Na) and/or potassium (K) ions) from getting into the underlying transistor and (2) serve as a sensing layer to absorb electric charges in analyte solution to the surface of the passivation layer 128. The passivation layer 128 can include any suitable material in accordance with the embodiments described herein. Examples of suitable materials that can be used to form the passivation layer 128 include, but are not limited to, a silicon nitride material (SiN), silicon oxynitride (SiON), metal oxides (e.g., aluminum oxides, tantalum oxides, hafnium oxides, titanium oxides, aluminum nitrides), polymers, organic nanodielectric materials, self-assembled monolayers (SAMs) such as, e.g., APTES (3-aminopropyltriethoxysilane), etc.

Figure 9:
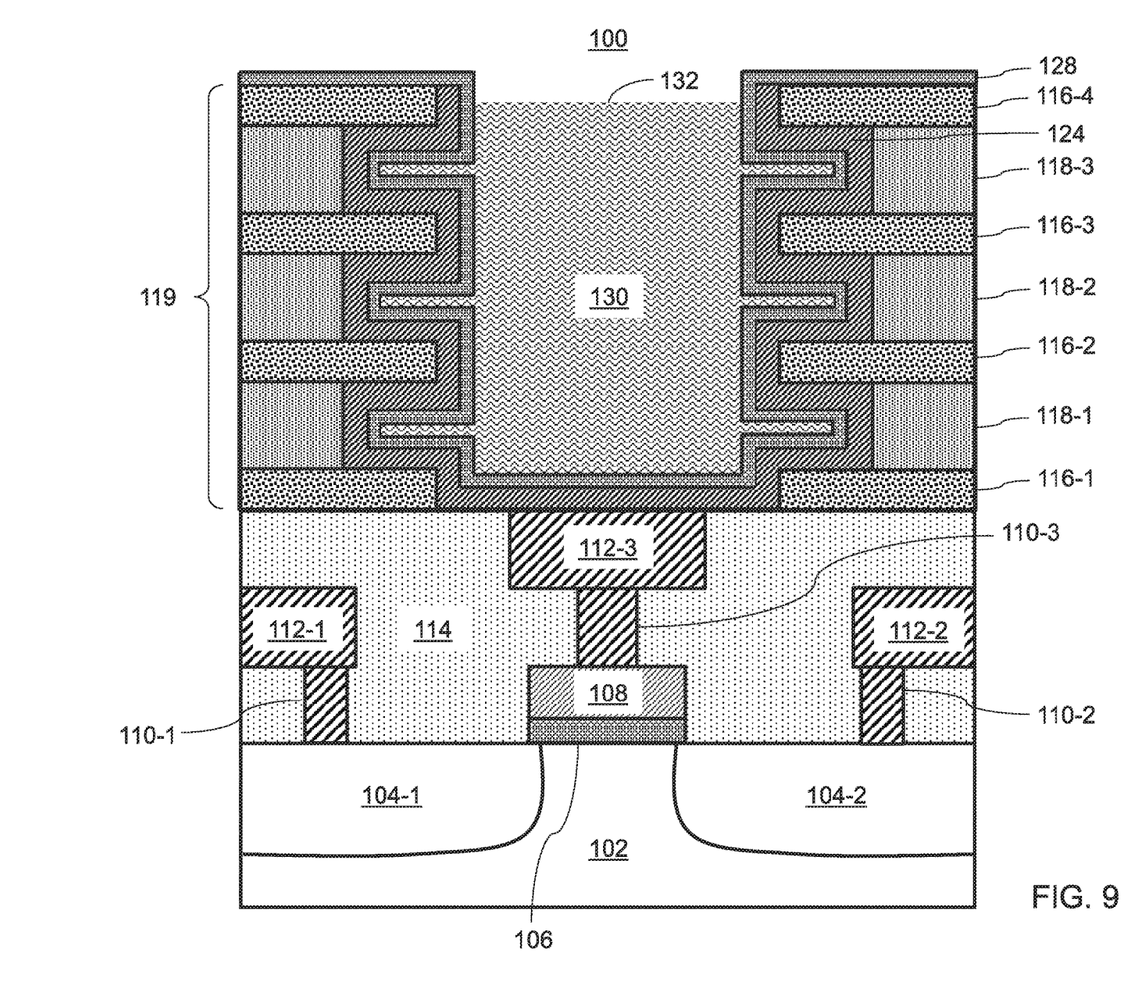
FIG. 9 is a cross-sectional view of the introduction of an analyte solution into the macrowell during the fabrication of the semiconductor device, in accordance with an embodiment of the present invention.

With reference to FIG. 9, an analyte solution 132 is introduced into the macrowell 130. After introducing the analyte solution 132, a plurality of electric charges 134 located within the macrowell 130 along the passivation layer 128, represented by "x" in FIG. 9, are also shown.

The term "analyte" is used herein to denote a substance (e.g., chemical or biological), or a chemical/biological constituent that can be subject to analyses and detection by ISFET sensing. That is, the analyte can include a chemical or biological material that has, or can generate, an electric charge in a solution (aqueous or non-aqueous (e.g., polar or non-polar)) such that the amount of electrical charge in the analyte solution 132 can be measured by the threshold voltage change of the underlying FET. Illustrative analytes that can be employed in the present include, but are not limited to, glucose, DNA, ions, etc. The analyte solution 132 can be introduced using any suitable techniques in accordance with the embodiments described herein. For example, and in one embodiment, the analyte solution 132 can be pumped from an external reservoir (not shown) to the macrowell 130 where analysis and detection of the analyte in the analyte-containing solution occurs by the mechanism mentioned above. Alternatively, the ISFET can be used as a gas sensor or sense electrolyte sensor.

Although the passivation layer 128 can prevent ions from getting into the underlying transistor and can serve as a sensing layer to absorb electric charges in the analyte solution 132 to the surface of the passivation layer 128, the passivation layer 128 can reduce the sensitivity of the underlying transistor.

For example, the passivation layer 128 can create a passivation capacitance ($C_p$) in series with a FET capacitance ($C_{FET}$). More specifically, as compared with the case without a passivation layer (e.g., analyte directly contacting gate), the sensitivity of the underlying ISFET can be reduced by a factor of A, where A can be expressed as $A = C_p/(C_p +$ $C_{FET}$). In the embodiment in which the passivation layer 128 has a thickness greater than that of the gate dielectric 106, $C_p$ can be less than $C_{FET}$, thereby resulting in sensitivity value of A of less than 1. Based on this, the sensitivity of the underlying transistor can be increased by increasing the value of $C_p$. There is a direct relationship between total capacitor surface area and $C_p$, such that the greater the total capacitor surface area, the larger the capacitance value of $C_p$. Accordingly, increasing the total capacitor surface area can result in enhanced sensitivity of the underlying transistor.

As mentioned above with reference to FIG. 3, the geometry of the well resulting from the selective etching of dielectric material in the stack 119 can increase total capacitor surface area as compared to other designs. That is, forming the microwell 120 using the selective etch, resulting in the macrowell 130, can enhance the sensitivity of the underlying ISFET by increasing capacitor surface area as compared to other designs.

Figure 10:
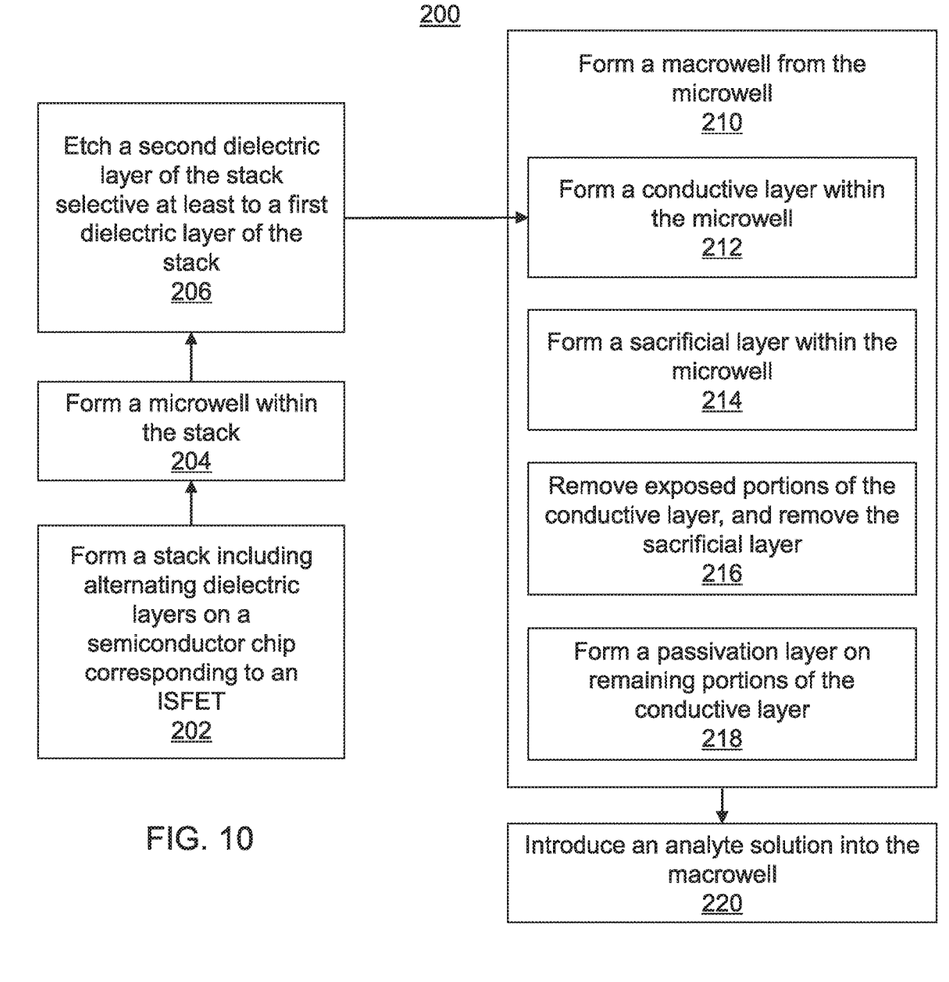
FIG. 10 is a block/flow diagram of a system/method for fabricating a semiconductor device including an ion-sensitive field-effect transistor (ISFET) with an alternating dielectric stack to enhance sensitivity, in accordance with an embodiment of the present invention.

With reference to FIG. 10, a block/flow diagram is shown illustrating a system/method 200 for fabricating a semiconductor device including an ion-sensitive field-effect transistor (ISFET) with an alternating dielectric stack, in accordance with an embodiment.

At block 202, a stack including alternating dielectric layers is formed on a semiconductor chip corresponding to an ISFET. The semiconductor chip, or integrated circuit, can include a metal-oxide-semiconductor field-effect transistor (MOSFET) device. The MOSFET device can include a substrate, source/drain regions, a gate structure including a gate conductor layer formed on a gate dielectric layer, a plurality of contacts and back-end-of-line (BEOL) structures and dielectric material. Forming the stack can include forming a first dielectric layer including a first material on the semiconductor chip, and forming a second dielectric layer including a second material on the first dielectric layer. In one embodiment, the first dielectric layer includes a carbon doped oxide dielectric material and the second dielectric layer includes silicon dioxide. For example, the first dielectric layer can include, e.g., SiCOH. Further details regarding block 202 are described above with reference to FIG. 1.

At block 204, a microwell is formed within the stack. More specifically, the microwell can be formed by etching through the stack, and stopping on the top surface of the semiconductor chip to expose the semiconductor chip. For example, a mask can be used to perform the etching to form the microwell, and the mask can be removed (e.g., stripped) after the microwell is formed. Further details regarding block 204 are described above with reference to FIG. 2.

At block 206, the second dielectric layer is etched selective at least to the first dielectric layer. In one embodiment, a wet etch process is used to perform the selective etch. For example, diluted hydrofluoric acid (dHF) can be used to perform the selective etch. The geometry resulting from the selective etch process (e.g., "comb" shaped geometry) can permit increased capacitor surface area as compared to other geometries (e.g., rectangular shaped geometries). As described in further detail above, sensitivity can be enhanced due to the increased capacitor surface area achieved by this geometry. Further details regarding block 206 are described above with reference to FIG. 3.

At block 210, a macrowell is formed from the microwell.

For example, forming the macrowell can include, at block 212, forming a conductive layer within the microwell. Forming the conductive layer can include forming the conductive layer having portions along exposed portions of the stack. The conductive layer can include any suitable conductive material (e.g., metal) in accordance with the embodiments described herein. Examples of suitable materials that the conductive layer can be formed from include, but are not limited to, ruthenium (Ru), gold (Au), platinum (Pt), palladium (Pd), nickel (Ni), cobalt (Co), aluminum (Al), silver (Ag), etc. The conductive layer can be formed using any suitable process in accordance with the embodiments described herein. Examples of suitable processes that can be used to form the conductive layer include, but are not limited to, atomic layer deposition (ALD), chemical vapor deposition (CVD), physical vapor deposition (PVD), etc.

Forming the macrowell can further include, at block 214, forming a sacrificial layer within the microwell. Forming the sacrificial layer within the microwell can include filling the microwell with a sacrificial material and planarizing and recessing the sacrificial material to a height within the stack to expose portions of the conductive layer disposed on top surfaces of the stack. The sacrificial layer can include any suitable material in accordance with the embodiments described herein. For example, the sacrificial layer can include, e.g., an optical planarization layer (OPL).

Forming the macrowell can further include, at block 216, removing the exposed portions of the conductive layer, and removing the sacrificial layer. The exposed portions of the conductive layer and the sacrificial layer can be removed using any suitable process in accordance with the embodiments described herein.

Forming the macrowell can further include, at block 218, forming a passivation layer on remaining portions of the conductive layer. The passivation layer can be formed using any suitable process in accordance with the embodiments described herein. For example, the passivation layer can be conformally deposited along exposed surfaces of dielectric layer portions and the remaining portions of the conductive layer. The passivation layer can have a thickness greater than that of the gate dielectric layer of the semiconductor chip. The passivation layer can include any suitable material in accordance with the embodiments described herein. Examples of suitable materials that can be used to form the passivation layer include, but are not limited to, a silicon nitride material (SiN), silicon oxynitride (SiON), metal oxides (e.g., aluminum oxides, tantalum oxides, hafnium oxides, titanium oxides, aluminum nitrides), polymers, organic nanodielectric materials, self-assembled monolayers (SAMs) such as, e.g., APTES (3-aminopropyltriethoxysilane), etc.

Further details regarding blocks 210-218 are described above with reference to FIGS. 4-8.

At block 220, an analyte solution is introduced into the macrowell. The introduction of the analyte solution can result in a plurality of electric charges located within the macrowell along the passivation layer. The analyte solution can be introduced using any suitable techniques in accordance with the embodiments described herein. For example, in one embodiment, the analyte solution can be pumped from an external reservoir to the macrowell, where analysis and detection of the analyte in the analyte-containing solution can occur. Alternatively, the ISFET can be used as a gas sensor or sense electrolyte sensor. Further details regarding block 220 are described above with reference to FIG. 9.

As described in detail above, ISFET sensitivity can be enhanced due to the increased capacitor surface area achieved by the geometry of the stack after the selective etch is performed. More specifically, the increased capacitor surface area corresponds to an increase in the passivation capacitance $C_p$.

Having described preferred embodiments of a semiconductor device including an ion-sensitive field-effect transistor (ISFET) with enhanced sensitivity and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a semiconductor device including an ion-sensitive field-effect transistor (ISFET) with enhanced sensitivity, comprising:
   forming a microwell within a stack including alternating dielectric layers formed on a semiconductor chip corresponding to the ISFET, the alternating dielectric layers including a first dielectric layer including a first material and a second dielectric layer including a second material disposed on the first dielectric layer;
   after forming the microwell, etching the second dielectric layer selective to at least the first dielectric layer using a wet etch process; and
   forming a macrowell from the microwell having a shape defined by the etching.

2. The method of claim 1, wherein the wet etch process employs diluted hydrofluoric acid.

3. The method of claim 1, wherein etching the second dielectric layer selective to at least the first dielectric layer results in the stack having a comb shaped geometry.

4. The method of claim 1, wherein forming the macrowell further includes forming a conductive layer having portions along exposed portions of the stack.

5. The method of claim 4, wherein forming the macrowell further includes:
   forming a sacrificial layer within the microwell, including filling the microwell with a sacrificial material and planarizing and recessing the sacrificial material to a height within the stack to expose portions of the conductive layer disposed on top surfaces of the stack;
   removing the exposed portions of the conductive layer; and
   removing the sacrificial layer.

6. The method of claim 5, wherein the sacrificial material includes an optical planarization layer (OPL).

7. The method of claim 5, wherein forming the macrowell further includes forming a passivation layer on remaining portions of the conductive layer.

8. The method of claim 1, further comprising introducing an analyte solution into the macrowell.

9. The method of claim 1, wherein the first dielectric layer includes a carbon doped oxide dielectric material and the second dielectric layer includes silicon dioxide.

10. A method for fabricating a semiconductor device including an ion-sensitive field-effect transistor (ISFET) with enhanced sensitivity, comprising:
   forming a stack including alternating dielectric layers on a semiconductor chip corresponding to an ISFET, including forming a first dielectric layer including a carbon doped oxide dielectric material on the semiconductor chip, and forming a second dielectric layer including silicon dioxide on the first dielectric layer;
   forming a microwell within the stack;
   after forming the microwell, etching the second dielectric layer selective to at least the first dielectric layer using a wet etch process employing diluted hydrofluoric acid; and
   forming a macrowell from the microwell having a shape defined by the etching.

11. The method of claim 10, wherein etching the second dielectric layer selective to at least the first dielectric layer results in the stack having a comb shaped geometry.

12. The method of claim 10, wherein forming the macrowell further includes forming a conductive layer having portions along exposed portions of the stack.

13. The method of claim 12, wherein forming the macrowell further includes:
   forming a sacrificial layer within the microwell, including filling the microwell with a sacrificial material and planarizing and recessing the sacrificial material to a height within the stack to expose portions of the conductive layer disposed on top surfaces of the stack;
   removing the exposed portions of the conductive layer; and
   removing the sacrificial layer.

14. The method of claim 13, wherein the sacrificial material includes an optical planarization layer (OPL).

15. The method of claim 13, wherein forming the macrowell further includes forming a passivation layer on remaining portions of the conductive layer.

16. The method of claim 10, further comprising introducing an analyte solution into the macrowell.

17. A semiconductor device including an ion-sensitive field-effect transistor (ISFET) with enhanced sensitivity, comprising:
   a semiconductor chip;
   a stack of alternating dielectric layers having a comb shape disposed on the semiconductor chip, the stack including a first dielectric layer including a first material and a second dielectric layer including a second material; and
   a macrowell defined by the comb shape of the stack, the comb shape enhancing sensitivity of the ISFET due to increased capacitor surface area.

18. The device of claim 17, wherein the macrowell further includes a conductive layer and a passivation layer disposed on the conductive layer.

19. The device of claim 17, further comprising an analyte solution located within the macrowell.

* * * * *